(12) United States Patent
Wells et al.

(10) Patent No.: US 10,714,938 B2
(45) Date of Patent: Jul. 14, 2020

(54) DECOUPLING SYNCHROPHASOR BASED CONTROL SYSTEM FOR MULTIPLE DISTRIBUTED ENERGY RESOURCES

(71) Applicant: PXiSE Energy Solutions, LLC, San Diego, CA (US)

(72) Inventors: Charles H. Wells, San Diego, CA (US); Raymond A. de Callafon, San Diego, CA (US); Patrick T. Lee, San Diego, CA (US)

(73) Assignee: PXiSE Energy Solutions, LLC, San Diego, CA (US)

( * ) Notice: Subject to any disclaimer, the term of this patent is extended or adjusted under 35 U.S.C. 154(b) by 163 days.

(21) Appl. No.: 15/988,842

(22) Filed: May 24, 2018

(65) Prior Publication Data

US 2018/0278057 A1    Sep. 27, 2018

Related U.S. Application Data

(63) Continuation of application No. 15/168,034, filed on May 28, 2016, now Pat. No. 10,027,119.

(51) Int. Cl.
*H02J 3/18*    (2006.01)
*H02J 3/38*    (2006.01)
(Continued)

(52) U.S. Cl.
CPC ............ *H02J 3/18* (2013.01); *G01R 19/2513* (2013.01); *G06Q 50/06* (2013.01); *H02J 3/24* (2013.01); *H02J 3/381* (2013.01); *H02J 3/382* (2013.01); *H02J 3/383* (2013.01); *H02J 3/386* (2013.01); *H02J 3/387* (2013.01); *H02J 3/46* (2013.01); *H02M 7/44* (2013.01); *Y02E 60/728* (2013.01); *Y04S 10/265* (2013.01)

(58) Field of Classification Search
CPC ........ H02J 3/18; H02J 3/24; H02J 3/38; H02J 3/381–3/383; H02J 3/386–3/387; H02J 3/46; G01R 19/2513; G06Q 50/06; H02M 7/44; Y02E 60/728; Y04S 10/265
USPC .......................................................... 307/24
See application file for complete search history.

(56) References Cited

U.S. PATENT DOCUMENTS

| | | |
|---|---|---|
| 6,819,087 B2 | 11/2004 | Delmerico et al. |
| 6,985,800 B2 | 1/2006 | Rehtanz et al. |

(Continued)

FOREIGN PATENT DOCUMENTS

| | | |
|---|---|---|
| CN | 102185326 A | 9/2011 |
| CN | 102707628 A | 10/2012 |

(Continued)

OTHER PUBLICATIONS

Patent Cooperation Treaty, International Search Report for PCT/US2017/034765, dated Oct. 9, 2017.

(Continued)

*Primary Examiner* — Hal Kaplan
(74) *Attorney, Agent, or Firm* — Jones Day

(57) ABSTRACT

Methods, systems, and controllers are described herein for controlling an electrical power system. A time-synchronized measurement of a phasor from one or more phasor measurement units is fed back to a feedback controller. Distributed energy resources of the electrical power system are controlled by the feedback controller using feedback control algorithms by sending, to distributed energy resources, a power setpoint derived from the time-synchronized measurement of the phasor.

49 Claims, 7 Drawing Sheets

(51) Int. Cl.
*H02J 3/24* (2006.01)
*H02J 3/46* (2006.01)
*G01R 19/25* (2006.01)
*G06Q 50/06* (2012.01)
*H02M 7/44* (2006.01)

(56) References Cited

U.S. PATENT DOCUMENTS

| | | |
|---|---|---|
| 7,096,175 B2 | 8/2006 | Rehtanz et al. |
| 7,490,013 B2 | 2/2009 | Wells |
| 7,498,821 B2 | 3/2009 | Wells |
| 7,710,729 B2 | 5/2010 | Li et al. |
| 7,755,371 B2 | 7/2010 | Wells |
| 7,961,112 B2 | 6/2011 | Wells |
| 7,987,059 B2 | 7/2011 | Gong et al. |
| 8,022,575 B2 | 9/2011 | Korba et al. |
| 8,457,912 B1 | 6/2013 | Wells |
| 8,498,752 B2 | 7/2013 | Wells |
| 8,532,230 B2 | 9/2013 | Taft |
| 8,659,186 B2 | 2/2014 | Teichmann et al. |
| 8,738,191 B2 | 5/2014 | Aivaliotis et al. |
| 8,892,375 B2 | 11/2014 | Taft |
| 8,907,615 B2 | 12/2014 | Mills-Price et al. |
| 8,942,856 B2 | 1/2015 | Ren et al. |
| 9,037,425 B2 | 5/2015 | Yang et al. |
| 9,043,037 B2 | 5/2015 | Bhageria et al. |
| 9,166,500 B2 | 10/2015 | Wu et al. |
| 9,230,429 B2 | 1/2016 | McKinley et al. |
| 9,411,389 B2 | 8/2016 | Shi et al. |
| 9,444,257 B2 | 9/2016 | Wells |
| 9,496,715 B2 | 11/2016 | Wilson |
| 9,507,367 B2 | 11/2016 | Venayagamoorthy et al. |
| 9,588,156 B2 | 3/2017 | Glavic et al. |
| 9,634,850 B2 | 4/2017 | Taft et al. |
| 2008/0071482 A1 | 3/2008 | Zweigle et al. |
| 2013/0043690 A1 | 2/2013 | Wilson et al. |
| 2013/0073108 A1 | 3/2013 | Kolwalkar |
| 2013/0073109 A1 | 3/2013 | Cheng et al. |
| 2013/0218494 A1 | 8/2013 | Chiang et al. |
| 2013/0262012 A1 | 10/2013 | O'Sullivan et al. |
| 2014/0070617 A1 | 3/2014 | Detmers et al. |
| 2014/0074311 A1 | 3/2014 | Kearns et al. |
| 2014/0100705 A1 | 4/2014 | Shi et al. |
| 2014/0159658 A1 | 6/2014 | Kiceniuk et al. |
| 2014/0244065 A1 | 8/2014 | Biswas et al. |
| 2014/0306534 A1 | 10/2014 | Shi et al. |
| 2014/0307494 A1 | 10/2014 | Wu et al. |
| 2015/0005967 A1 | 1/2015 | Jóhannsson et al. |
| 2015/0006141 A1 | 1/2015 | Enenkel et al. |
| 2015/0051852 A1 | 2/2015 | Pan et al. |
| 2015/0051856 A1 | 2/2015 | Chu et al. |
| 2015/0073735 A1 | 3/2015 | Abido et al. |
| 2015/0100282 A1 | 4/2015 | Shokooh et al. |
| 2015/0326160 A1 | 11/2015 | Diez-Maroto et al. |
| 2016/0003879 A1 | 1/2016 | Wilson et al. |
| 2016/0091537 A1 | 3/2016 | Gaarder et al. |
| 2016/0118878 A1 | 4/2016 | Alteneiji |
| 2016/0179120 A1 | 6/2016 | Boardman et al. |
| 2016/0198245 A1 | 7/2016 | Rhoads et al. |
| 2016/0241035 A1 | 8/2016 | Shi et al. |
| 2016/0266559 A1 | 9/2016 | Shi et al. |
| 2016/0299187 A1 | 10/2016 | Liang et al. |
| 2016/0313197 A1 | 10/2016 | Acharya et al. |
| 2016/0320435 A1 | 11/2016 | Budhraja et al. |
| 2016/0329700 A1 | 11/2016 | O'Brien et al. |
| 2016/0329709 A1 | 11/2016 | Park et al. |
| 2016/0334447 A1 | 11/2016 | Parashar et al. |
| 2017/0012468 A1 | 1/2017 | Park |
| 2017/0017298 A1 | 1/2017 | Biswas et al. |
| 2017/0104366 A1 | 4/2017 | Münz |
| 2017/0109524 A1 | 4/2017 | Kolacinski et al. |

FOREIGN PATENT DOCUMENTS

| | | |
|---|---|---|
| CN | 203166515 U | 8/2013 |
| CN | 103414245 A | 11/2013 |
| CN | 103474992 A | 12/2013 |
| CN | 103632313 A | 3/2014 |
| CN | 104242462 A | 12/2014 |
| CN | 104297632 A | 1/2015 |
| CN | 104865474 A | 8/2015 |
| CN | 105224811 A | 1/2016 |
| CN | 105375484 A | 3/2016 |
| CN | 105529704 A | 4/2016 |
| CN | 106383287 A | 2/2017 |
| CN | 106443246 A | 2/2017 |
| EP | 1 830 447 A1 | 9/2007 |
| EP | 1 919 076 A2 | 5/2008 |
| EP | 2 182 207 A2 | 5/2010 |
| KR | 20160038927 A | 4/2016 |
| WO | 2011150247 A1 | 12/2011 |
| WO | 2014061889 A1 | 4/2014 |

OTHER PUBLICATIONS

Patent Cooperation Treaty, Written Opinion of the International Searching Authority for PCT/US2017/034765, dated Oct. 9, 2017.

DECOUPLING SYNCHROPHASOR BASED CONTROL SYSTEM FOR MULTIPLE DISTRIBUTED ENERGY RESOURCES

CROSS REFERENCE TO RELATED APPLICATION

This application is a continuation of U.S. application Ser. No. 15/168,034, titled "Decoupling Synchrophasor Based Control System for Multiple Distributed Energy Resources," filed May 28, 2016, the contents of which are incorporated herein by reference in its entirety.

TECHNICAL FIELD

The invention relates to electrical power grids and, more specifically, to methods and systems for monitoring and controlling power flow in such electrical power grids.

BACKGROUND

Distributed energy resources (DERs), which include renewable energy power sources, such as solar photovoltaic (PV) arrays and wind turbines, are often connected directly to distribution systems that are part of an area electric power system (EPS). A large fraction of renewable energy resources will be installed in utility and customer owned distribution systems as individual States try to attain their Renewable Portfolio Standards (RPS). At 50% or greater total renewable generation, it will be difficult to control frequency and voltage to within acceptable standards without active feedback controls. Additionally, some cities such as San Diego are planning on having 100 percent renewable energy within its city limits by 2035. Many of the renewable power sources will come from small residential rooftop solar systems operating in low voltage distribution systems. There will be many independent participants installing renewable DERs without knowledge of the impact on the grid of the distributed resources and without adequate control of local frequency and voltage. The renewable energy resources (Solar PV, fuel cell, battery, wind) have little or no inertia since they are connected to a power electronics device that converts DC power into AC power. Diesel generators, on the other hand, have inertia and will contribute this to the adjacent connected grid load. Controllable loads can also be considered DERs since their power consumption can be regulated thus providing an additional means of control and providing inertia from the load side. These forms of DERs have higher inertia loads than typical renewable generation; however, they both should be used in a coordinated control system to regulate the frequency and voltage of the local EPS.

Low inertia systems are difficult to control compared to systems with high inertia from rotating energy sources. The IEEE 1547.4 standards clearly point out the sensitivity of DERs to instability and voltage stability issues in the presence of low inertia generation sources. Lack of control of the power characteristics DER power injection can cause large variations in frequency or voltage exceeding standards that can cause the feeder or substation to disconnect from the area EPS. In a typical distribution feeder, one or more DERs may supply up to 10 MW of power. With adequate control and coordination, one or more DERs in combination with multiple feeders can form the basis of a microgrid.

U.S. Pat. No. 8,457,912 describes a method of creating a smooth angle from the discontinuous angle measured from the PMU. The method includes detecting the change in direction of the angle and compensating for the discontinuous wrap at plus or minus 180°. This method is required in order to compute a smooth angle and a smooth angle difference that are used in the control system.

U.S. Pat. No. 8,498,752 describes a method of decoupling real and reactive power from changes in voltage and angle. It also teaches that the control system can be reversed so that the voltage and angle can be controlled to a constant value by simultaneously changing the real and reactive power. The controller uses the basic principle that the response to real and reactive power injection causes a simultaneous change to voltage and angle by fundamental physics known as Ohm's law.

The controller also assumes that the network impedance is constant and is a known value. The nonlinear systems are linearized around and operating point resulting in a linear set of equations that are used in the coupled controller. The patent teaches how the system can be linearized around an operating point and then any linear control System Technology can be used to configure the controller.

U.S. patent application Ser. No. 14/956,684 teaches how multiple decoupled controllers can be configured in cascade mode to form a hierarchical control system. It provides an explicit example of how the Smith predictor controller could be used in the control system design. Additionally, the controller technology recommended is based on commonly used proportional plus integral and derivative control. The patent also teaches that the controls can be reversed so that the input and output variables at any one level can be reversed to form a set of hierarchical controllers that can be configured in cascade mode to perform a number of control system functions in Electric Power Networks.

SUMMARY

The present invention relates to the use of a hierarchy of 2×2 decoupled controllers for controlling DERs connected to power grids. These DERs can be any combination of very low inertia DERs such as batteries and solar PV arrays or slower responding DERs such as controllable loads in buildings, conventional thermal inertia based generation or any mix of hydro or wind generation with differing dynamic response. This invention is related to prior work by one of the present inventors, namely, two U.S. Pat. Nos. 8,498,752 and 8,457,912 and patent application Ser. No. 14/956,684, all of which are incorporated herein by reference. These teach how to decouple voltage and frequency and unwrap angle information from phasor measurement units (PMUs). The controls are accomplished by using real time feedback control to regulate power flow, voltage and frequency (or angle) by adjusting real and reactive power demand set point pairs of DERs.

The teachings of the present invention improves and extends the above prior work in various significant ways. The teachings of the present invention provide a unique and innovative approach to using phasor measurements directly in the control system. It also clearly teaches how the controller can be designed without the explicit knowledge of the impedance between two points in the power grid. This invention also teaches that the phasor controls can also be reversed and used in a cascade mode. It also teaches that both the voltage phasors and current phasors can be used as the primary measured variables in the control system. In both cases, the control system is linear in the phasor variables. This makes the controller easy to tune and configure using conventional off the shelf control System Technology tools. Other unique features of the invention include the use of a filtered output from the controller, a use of a filtered derivative to compute the derivative action of the controller and the separation of the proportional and integral part of the controller. Additionally, a unique method of decoupling is performed outside of the controller function in a separate decoupling matrix. This makes the coupling far easier than in prior work. Additionally, the present invention explicitly outlines the use of setpoint feed forward control, which is important for fast response to the disturbances in the Power Network. Additionally, the controller explicitly includes a method of modeling the process that includes four linear filters that are used to represent the dynamic state of the control system. These filters are extensively used in the controller such that the internal functionality of the controller has a limited number of independent control system objects. This current controller can be configured so that it operates as a controller without using the Smith predictor, a controller that can be used specifically for power control, and a controller that can be configured as two independent single input single output controllers. The present invention also explicitly describes how the controller can be configured control the current and power angle or the voltage and voltage angle. This flexibility is useful in the control of microgrids.

According to teachings of the present invention, the controller in U.S. Pat. No. 8,498,752 can be re-structured to control voltage magnitude and voltage angle and or the current magnitude and power angle by adjusting real and reactive power setpoint pairs of the DER, and the controls can be reversed and used to control real and reactive power using voltage magnitude and voltage angle or current magnitude and power angle setpoint pairs. The control system uses the unwrapped angle rather than a frequency signal derived from the angle measurement. The usage of this system automatically controls frequency since it is defined as the rate of change of voltage angle and, hence, if the angle is constant, by definition, the frequency is constant. According to teachings of the present invention, the controller may be operated at higher speeds compared to conventional Energy Management Systems, and time synchronized data may be used in the control system operations. The present invention provides an enhancement to traditional real and reactive power control that currently uses slow speed and non-synchronized open loop control.

In one aspect, the invention uses time synchronized real and reactive power measurements in a high-speed feedback control system designed to mitigate disturbances while regulating the system to a specified real and reactive power setpoints. It also includes a control system that controls the state or the power of the system using the same controller structure. It incorporates a separate proportional-integral combined with a derivative filter to mitigate power grid disturbances and also an output filter to adjust the output signal according to the response characteristics of the DERs. The invention provides an increase in the performance of the control system by using decoupled time synchronous input and output measurements. It uses either the decoupled pair (voltage magnitude and voltage angle) or the decoupled pair (current magnitude and power angle) as measured variables to precisely control real and reactive power while operating at high rates. This control structure can be reversed to form a decoupled control system regulating the pair (real power and reactive power) to obtain decoupled phasor output setpoints pairs for either (current magnitude and power angle) or (voltage magnitude and voltage angle.) These identically structured controllers can be used in cascade mode to directly control the power demand of the DER.

According to another aspect, the invention provides a control system including a first 2×2 decoupled controller that controls current magnitude and power angle (difference between the voltage angle and current angle) by adjusting real and reactive power using real time feedback, and a reverse 2×2 decoupled controller that controls real and reactive power by adjusting current magnitude and power angle setpoints using real time feedback. The first 2×2 decoupled controller and second 2×2 decoupled controller can be used independently or where the second the second 2×2 decoupled controller is a supervisory controller of the first 2×2 decoupled controller.

In some embodiments, the first 2×2 decoupled controller is a unit level controller directly manipulating devices that control the supply and/or demand of a power bus, and the second 2×2 decoupled controller controls real and reactive power of the grid to specified setpoints by adjusting current magnitude and power angle setpoints of one or more unit controllers using real time feedback. In this case, the supervisory controller has specified real and reactive power setpoints.

In one aspect, the invention provides a method for decoupling control of real and reactive power of a local electrical power system having multiple distributed energy resources at non-co-located points. The multiple distributed energy resources may include a combination of energy generation devices, controllable energy loads, and energy storage devices. The method includes feeding back time-synchronized measurements of voltage phasors and current phasors from multiple phasor measurement units to multivariable linear decoupling controllers; and controlling the distributed energy resources by the multivariable linear decoupling controllers, wherein the controlling comprises sending to the distributed energy resources real and reactive power setpoint pairs derived from the time-synchronized measurements of voltage phasors and current phasors using linear control.

The feeding back may include feeding back phasor measurements from multiple level 1 controllers to a level 2 controller, such that the multivariable linear decoupling controllers form a hierarchical feedback control system; converting measured real and reactive power values to current and power angle phasors; and/or converting measured real and reactive power values to voltages and voltage angle differences between points of interest and the distributed energy resources.

Controlling the distributed energy resources by the multivariable linear decoupling controllers may include: using a proportional-integral controller combined with a derivative filter to mitigate power grid disturbances, and an output filter to adjust output setpoint pairs according to a response characteristics of the distributed energy resources; using an internal predictive model to account for system dynamics and transport delay in obtaining phasor feedback; using a feed forward filter for providing a faster phasor control in response to immediate set point changes; and/or computing the real and reactive power setpoint pairs to achieve a predetermined power control at a Point Of Interest.

DETAILED DESCRIPTION

Nomenclature and Abbreviations

Figure 1:
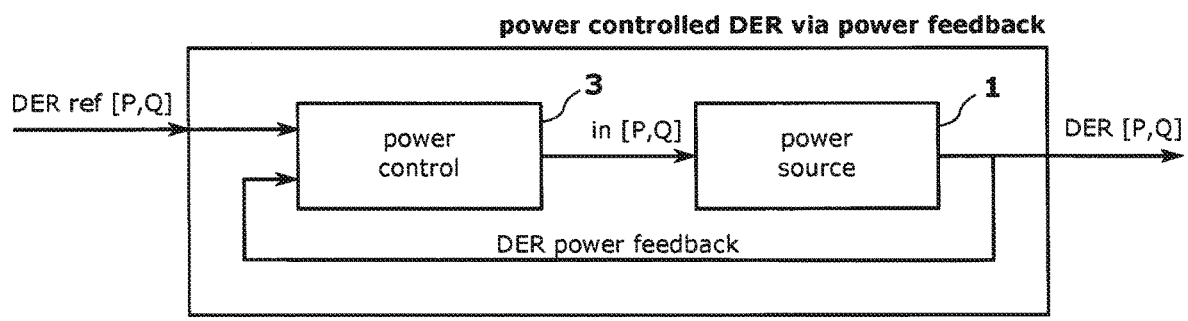
FIG. 1 is a schematic block diagram of a traditional power controlled single Distributed Energy Resource (DER), accepting a real/reactive power reference input for the controlled DER and producing a real/reactive power output at the DER, monitored and controlled using a power controller that produces real/reactive power input at the DER and uses feedback of the produced real/reactive power output at the DER.

V—voltage amplitude measured in volt
β—unwrapped voltage phase angle, measured in radians
v—voltage phasor consisting of (V, β) pair
f—power frequency
I—current amplitude measured in ampere
γ—unwrapped current phase angle measured in radians
i—current phasor consisting of (I, γ) pair
α—power angle and defined as difference between β and γ
$I_p$—current power phasor $I_p = Ie^{i\alpha}$
$I_c$—real part of current power phasor
$I_s$—imaginary part of current power phasor
VA—Voltage Ampere
P—real power, measured in Watt
Q—reactive power, measured in VA
S—apparent power (complex number S=P+jQ)
Z—complex impedance $Z=|A|e^{j\theta}$
|Z|—absolute value of complex impedance
θ—angle of impedance Z
δ—difference between voltage angles $δ_b$ at location b and voltage angle $β_a$ at location a in EPS
a tan 2( )—four quadrant inverse tangent
Area EPS—the main power grid that connects many local EPS
Local EPS—a local power grid such as a Micro grid
Macro grid—the main power grid to which the microgrid is attached
Micro grid—a collection of loads and resources that act as a single point of control to the macro-grid and can disconnect and re-connect to the macro-grid Area EPS is generally the part the network supplying power to the microgrid. Often this is at a higher voltage (69 kV) compared to the local EPS (12 kV). There is a transformer and a breaker between the two. The breaker a remotely operated switch that separates the local EPS from the area EPS. The breaker separating the two grids is called a Point of Common Coupling if the local EPS is a microgrid. It is important that the local EPS can be continually connected to the area EPS, but our controller provides demand regulation services to the local EPS. A local EPS could be a commercial or industrial building with solar PV and a Battery.

POI—Point Of Interest
PCC—Point of Common Coupling (which may refer to POI)
DER—distributed energy resources, examples include Photovoltaic or Battery Inverter based systems, fuel cells, wind power, CHP such as combined cycle gas turbine or micro generator, fuel cells and batteries.
PMU—phasor measurement unit
Control—the process of adjusting the input to a system to cause the output to achieve a specified setpoint.
Setpoint—the specified value of an output variable in a process
Controller—the system that compares the controller setpoint with the output variable and makes adjustments to the process input variables. This can be hardware or software. In this description, the controller is software.
CDER—a controlled distributed energy resource
MDER—multiple distributed energy resources
MIMO—Multi Input, Multi Output
PI—Proportional and Integral
FD—Filtered Derivative Relation Between Phasors and Real/Reactive Power The electric behavior at any Point Of Interest (POI) in a (single phase) Alternating Current (AC) electric power system (EPS) is characterized by a voltage of the format $v(t)=V \sin(2\pi ft+\beta)$ and a current of the format $i(t)=I \sin(2\pi ft+\gamma)$. The AC voltage magnitude V and voltage angle β, collectively called the voltage phasor v=(V,β) and the AC current magnitude I and current angle γ, collectively called the current phasor i=(I,γ) are related through Ohm's law. In an EPS, the complex impedance plays an important role in Ohm's law. In case the complex impedance is a linear (dynamic) system, the complex impedance can be represented by a complex number $|Z|e^{j\theta}$ and denoted simply by the complex number Z with an absolute value of the impedance denoted by |Z| and a phase shift of the impedance denoted by θ. With the notion of a complex impedance Z, Ohm's law for a linear (dynamic) system states that the voltage phasor v and current phasor i are related via v=Zi. This makes the magnitude V related to the current magnitude I via the equation V=|Z|I, whereas the voltage angle $\beta$ is related to the current angle $\gamma$ via $\beta=\theta+\gamma$ due to the complex calculation v=Zi. The impedance Z in an EPS may refer to, but is not limited to, an electrical source producing electrical power, an electrical line transporting electrical power or an electrical load consuming electrical power.

As outlined in referenced U.S. Pat. No. 8,498,752, the AC voltage magnitude V, voltage angle $\beta$, the AC current magnitude I, current angle $\gamma$, and the AC frequency f are available from Phasor Measurement Units deployed in an EPS. The AC voltage magnitude V and voltage angle $\beta$ are collectively called the voltage phasor v and the voltage phasor v can be represented by the pair v=(V,$\beta$) or the complex vector $v=e^{j\beta}$, where j is the complex number with $j^2=-1$. Similarly, the AC current magnitude I and current angle $\gamma$ are collectively called the current phasor i and the current phasor i can be represented by the pair i=(I,$\gamma$) or the complex vector $i=e^{j\gamma}$. The voltage phasor v and current phasor i can be used to obtain derivative information that may include, but is not limited to, the real power P and reactive power Q that characterize the electrical power flow from, through or into an impedance Z located in the EPS.

In case the impedance $Z=|Z|e^{j\theta}$ between a location a and a location b in an EPS is known and characterized by its amplitude |Z| and its phase angle $\theta$, the real power P and reactive power Q flow through the known impedance from location a to location b can be computed by $$P = \frac{V_a V_a}{2|Z|}\cos(\theta) - \frac{V_a V_b}{2|Z|}\cos(\theta - \delta) \text{ and}$$

$$Q = \frac{V_a V_a}{2|Z|}\sin(\theta) - \frac{V_a V_b}{2|Z|}\sin(\theta - \delta)$$

where $V_a$ and $V_b$ are the voltage amplitudes respectively at location a and location b and where $\delta=\beta_b-\beta_a$ is the difference between voltage phase angle $\beta_b$ at location b and voltage phase angle $\beta_a$ at location a. The above formula indicates that real P and reactive Q power flow between two locations in an EPS can be derived from the equivalent impedance Z between the two locations in the power grid and the voltage phasor measurements $v_a=(V_a,\beta_a)$ and $v_b=(V_b,\beta_b)$ respectively at the two locations a and b in the EPS.

In case the power flow at a particular POI in the EPS needs to be monitored and controlled, both the voltage the voltage phasor (V,$\beta$) and the current phasor (I,$\gamma$) can be used to compute the real power P and reactive power Q. A particular POI in the EPS may include, but is not limited to, the location of a Distributed Energy Resource (DER) in the EPS or a Point Of Interest (POI) in the EPS that may include the Point Of Interest (POI) where a local EPS connects to the main EPS. The real power P and reactive power Q flow at a POI can be computed by $$P = \frac{VI}{2}\cos(\alpha) \text{ and } Q = \frac{VI}{2}\sin(\alpha)$$

where V and I are respectively the voltage amplitude V and the current amplitude I at the POI, and the angle $\alpha=\beta-\gamma$ is the difference between voltage phase angle $\beta$ and the current phase angle $\gamma$ at the POI. The angle $\alpha$ is also referred to as the power angle $\alpha$, as it directly related to the (normalized) size and direction of the real and reactive power flow with $\cos(\alpha)$ and $\sin(\alpha)$ always in the range between −1 and 1. Based on the power angle $\alpha$ we also define the notion of a current power phasor $I_p=Ie^{j\alpha}$ that combines the information on the current amplitude I and power angle $\alpha$.

FIG. 1 depicts the conceptual arrangement of a standard power-based approach to control a power source producing real/reactive AC power in an EPS via power feedback. As shown in the arrangement of FIG. 1, the power source 1 conceptually accepts a real/reactive input pair denoted by in [P,Q] and will produce an actual real/reactive output pair at the DER denoted by DER [P,Q]. To ensure the produced real/reactive output pair DER [P,Q] matches a desired reference real/reactive output pair denoted by DER ref [P,Q] in FIG. 1, a power control 3 implements a control algorithm that compares DER ref [P,Q] and DER [P,Q] and produces the real/reactive power input in [P,Q]. It is clear that the power control algorithm is using feedback information of the produced real/reactive power output (DER power feedback) to monitor and control the produced power at the output of the DER.

Although direct feedback information of power flow as illustrated in FIG. 1 is a viable approach to monitor and control the power flow produced by a power source, the above formulae indicate that real/reactive power flow at a POI in a power grid can be derived directly from the time synchronized measurements of the voltage phasor v=(V,$\beta$) and the current phasor i=(I,$\gamma$), collectively called the phasors. Therefore, the size and direction of real and reactive power flow at any POI in an EPS can be controlled by changing the voltage phasor v=(V,$\beta$) or the current phasor i=(I,$\gamma$) and in particular the power angle $\alpha=\beta-\gamma$ and the product VI of the voltage amplitude V and current amplitude I. Although there seems to be no distinction between using phasors [v,i] information or real/reactive power [P,Q] information, there are three clear advantages of using phasors [v,i] for (power) control instead of using the real/reactive power pair [P,Q].

The first advantage of using phasor [v,i] for feedback is due to the fact that phasors at different locations in an EPS may be linearly (dynamically) related. The linear relation is guaranteed provided the impedance Z between the phasors is a linear dynamic system. However, even if Z is a linear dynamic impedance, the real/reactive power [P,Q] will always be a non-linear relation due to the product of voltage phasor v and current phasor i. For example, the voltage phasor $v_{out}$ over a load modelled by the impedance $Z_L$ and produced by a voltage source yin with a line impedance $Z_{in}$ is given by $v_{out}=Zv_{in}$ where $$Z = \frac{Z_L}{Z_L + Z_{in}}$$

If indeed Z is a linear dynamic impedance, the voltage phasor $v_{out}$ depends linearly on the voltage phasor $v_{in}$. Hence, using phasors [v,i] for feedback allows the use of linear control algorithms to control phasor and the resulting power flow in an EPS.

The second advantage of using phasor [v,i] for feedback is due to the fact that the real/reactive power pair [P,Q] is inherently a trigonometric statically coupled pair and related via the apparent power S=P+jQ and the power angle $\alpha$ mentioned above. This means that increasing the size |S| of the apparent power may be done by either increasing the real power P or the reactive power Q, but to maintain the same ratio between P and Q, any changes in P must be coupled to the changes in Q. This always requires the real/reactive power pair [P,Q] to be treated as a coupled pair during power control. Using phasors [v,i] for feedback and in particular using either the current amplitude/power angle pair [I,α] or the Voltage amplitude/power angle pair [V,α] does not require static coupling between a phasor amplitude and power angle pair.

The third advantage of using phasor [v,i] for feedback is due to the fact that the phasor pair [v,i] contains more information than the real/reactive power pair [P,Q]. As shown below, power flow information represented by the real/reactive pair [P,Q] does not contain full information about the voltage v=(V,β) and current phasor i=(I,γ): only the phase difference α=β−γ (power angle) between the voltage angle β and the current angle γ and the product VI of the voltage amplitude V and current amplitude I can be reconstructed from the real/reactive pair [P,Q]. However, having access to the phasor pair [v,i] allows power(flow) at a particular POI in an EPS to be computed, whereas the individual voltage phasor v=(V,β) and current phasor i=(I,γ) also contain information about the individual voltage amplitude V, current amplitude I and voltage angle β and current angle γ useful for voltage angle or current angle tracking control systems.

Figure 2:
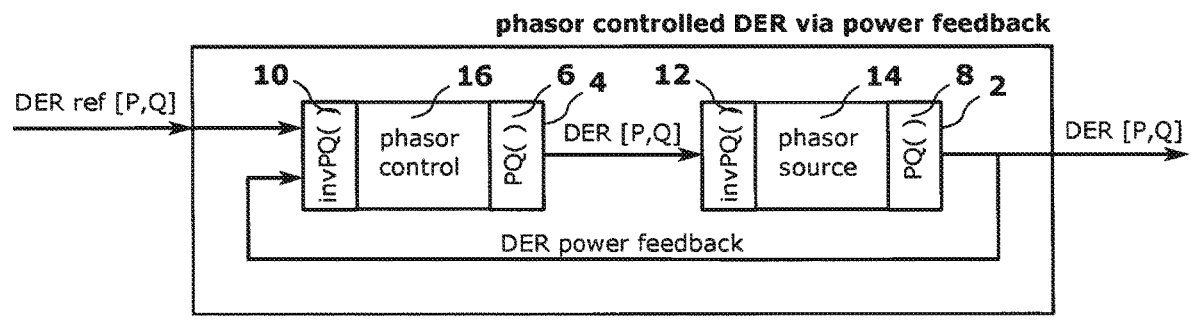
FIG. 2 is a schematic block diagram of a phasor controlled single Distributed Energy Resource (DER), accepting a real/reactive power reference input for the controlled DER and producing a real/reactive power output at the DER, monitored and controlled by a phasor controller that produces real/reactive power input at the DER and uses feedback of the produced real/reactive power output at the DER, according to an embodiment of the present invention.

FIG. 2 depicts the conceptual arrangement of a phasor-based control approach to control the power source 2 which is a modified version of power source 1 shown earlier in FIG. 1. For notational convenience, the formulae for computing the real/reactive power pair [P,Q] on the basis of phasors pair [v,i] is denoted by the function PQ( ) and indicated by the function blocks 6 and 8 in FIG. 2. The function operation [P,Q]=PQ(v,i) indicates that the (single phase) real/reactive power pair [P,Q] is computed from information of the voltage phasor v and current phasor i according to P=VI/2·cos(α) and Q=VI/2·sin(α) in which α=β−γ. The computation of real/reactive power can easily be extended to common three phase AC system where three voltage and current phasors for each phase are available.

Conversely, given a real and reactive power pair (P,Q) at any POI in the EPS, the power angle α=β−γ and the product VI of the voltage amplitude V and current amplitude I and can be computed via $$\alpha = a\tan 2(Q,P)$$

and $$VI = 2\cdot\sqrt{P^2+Q^2}$$

where a tan 2( ) denotes the four quadrant inverse tangent, creating a power phase angle α in the interval between −π and π radians. The above formulae indicate that information on the real and reactive power pair [P,Q] is not sufficient to reconstruct the full information on the voltage phasor v=(V,β) and/or the current phasor i=(I,γ). Only the difference α=β−γ between the voltage angle β and the current angle γ and the product |S|=VI of the voltage amplitude V and current amplitude I can be reconstructed. However, additional information on either the voltage phasor v=(V,β) or the current phasor i=(I,γ) suffices to reconstruct the phasor pair [v,i] from real and reactive power pair (P,Q).

For notational convenience, the inverse operation from the real and reactive power pair [P,Q] back to any information on the phasors will be denoted by the function invPQ( ) and marked as function block 10 and 12 in FIG. 2. The information on the phasors computed by the function invPQ( ) may use information on the voltage phasor v=(V,β) or the current phasor i=(I,γ) and may also have different embodiments, altering the signals used in the internal phasor control 16 in FIG. 2.

In one embodiment called polar phasor current control, the function operation [I,α]=invPQ(P,Q) may refer to the computation of the polar coordinates (I,α) representing the power angle α=β−γ and the current amplitude I of the complex power current $I_p = Ie^{j\alpha}$ computed from information of the real power P and reactive power Q according to α=a tan 2(Q,P) and I=2/V·$\sqrt{P^2+Q^2}$.

In another embodiment function called rectangular current phasor control, the operation [$I_c$,$I_s$]=invPQ(P,Q) may refer to the computation of the rectangular coordinates [$I_c$,$I_s$] representing the real part $I_c$=I cos(α) and the imaginary part $I_s$=I sin(α) of the complex power current $I_p$=Ie$^{j\alpha}$ computed from information of the real power P and reactive power Q according to $I_c$=2P/V and $I_s$=2Q/V assuming the voltage V≠0.

It is worth noting that if the function invPQ( ) simply passes through the real and reactive power [P,Q]=invPQ(P,Q), the phasor control 16 in FIG. 2 has the result that power control 4 reduces back to the power control 3 of FIG. 1. Clearly, the use of phasor control 16 allows for different embodiments that exploit the three clear advantages of using phasors [v,i] for (power) control instead of using the real/reactive power pair [P,Q] as mentioned earlier. For notational convenience we use the same notation of phasors [v,i] as the output of the function invPQ( ) marked as function block 12 in FIG. 2 to refer to the different embodiments that convert information on real and reactive power pair [P,Q] back to any information on the phasors.

For comparison we now refer to both FIG. 1 and FIG. 2, where in FIG. 1 the power source 1 and a power control 3 systems are present, while in FIG. 2 these are modified to become power source 2 and a power control 4 systems. However, in FIG. 2 the invPQ( ) function block 12 is placed at the input of the phasor source 14 and PQ( ) function block 8 is placed at the output of the phasor source 14. This concept allows the power source 2 to be represented as a series connection of the invPQ( ) function block 12, a phasor source 14 and a PQ( ) function block 8. Similarly, with the invPQ( ) function block 10 in place at the input of the phasor control 16 and PQ( ) function block 6 in place at the output of the phasor control 16, internally the power control 4 can now be represented as a series connection of the invPQ( ) function block 10, a phasor control 16 and a PQ( ) function block 6.

Although the external arrangement of power control using the novel phasor-based approach in FIG. 2 appears the same as in FIG. 1, the internal phasor-based operation is significantly different. The advantage of separating the invPQ( ) function block 10, the phasor control 16 and the PQ( ) function block 6 from the power control 4 allows the phasor control algorithm in the phasor control 16 to be designed on the basis of phasor source 14. With the linear dynamic relationship between phasors (v,i) in the presence of a linear impedance Z in the EPS, the phasor control algorithm may be linear and will be much easier to design. Furthermore, due to trigonometric static coupling between P and Q in the real/reactive power pair [P,Q], the separation of the invPQ ( ) function block 10 and the PQ ( ) function block 6, a decoupling based phasor control system is provided in the form of the phasor control 16. However, the phasor-based approach in FIG. 2 is still using real/reactive power [P,Q] as feedback information and an additional step is taken to also replace the feedback information on the real/reactive power

[P,Q] with feedback information on the actual phasor [v,i] to provide a true decoupling synchrophasor based control system.

Level 1 Control of a Controlled Distributed Energy Resource

Figure 3:
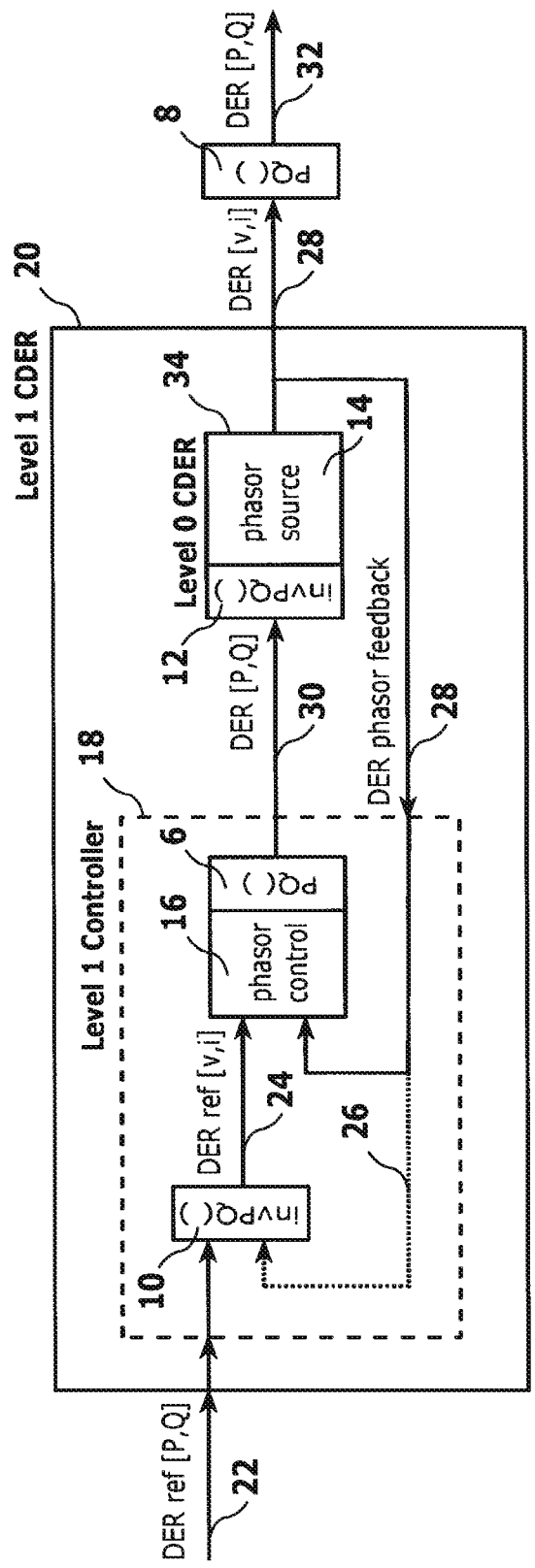
FIG. 3 is a schematic block diagram of a Level 1 phasor controlled single Distributed Energy Resource (DER), accepting a real/reactive power reference input for the controlled DER and producing a real/reactive power output at the DER, monitored and controlled by a Level 1 phasor controller that produces real/reactive power input at the DER and uses feedback of the produced phasor output at the DER, according to an embodiment of the present invention.

FIG. 3 depicts the conceptual arrangement of a decoupling synchrophasor based control system called the Level 1 Controlled Distributed Energy Resource or Level 1 CDER for short. The Level 1 indication is used to distinguish the hierarchical controller structure defined over several levels to define a decoupling synchrophasor based control system for multiple distributed energy resources. The control algorithm in FIG. 3 uses real-time feedback measurements of the phasors (V,β) and (I,γ) to control real/reactive power pair (P,Q) at a POI in an EPS. As a result, the PQ( ) function block 8 has now been split from power source 14 used earlier in FIG. 2 and direct DER phasor feedback information is sent back to the Level 1 Controller 18 in FIG. 3. The series connection of the invPQ( ) function block 12 and the phasor source 14 has been labelled Level 0 CDER 34 to distinguish this DER at the lower level 0 from the phasor controlled DER at the higher level 1. The combination of the Level 0 CDER 34 along with the DER phasor information feeding back into the Level 1 Controller 18 and producing real/reactive power input DER [P,Q] 30 for the Level 0 CDER 34 is now indicated as a Level 1 CDER 20 in FIG. 3. It should be noted that the Level 1 CDER 20 has the same input/output format as the Level 0 CDER 34, enabling the hierarchical structure of different controller levels.

The information and power flow of the Level 1 CDER 20 in FIG. 3 is as follows. Starting from the left side of FIG. 3, the real/reactive power reference signal labelled DER ref [P,Q] 22 feeds into the Level 1 CDER 20 and then into the Level 1 Controller 18. In the Level 1 Controller 18 first the real/reactive power reference signal DER ref [P,Q] 22 is converted into a phasor reference signal DER ref [v,i] 24 via the invPQ( ) function block 10. The invPQ( ) function block 10 in FIG. 3 is the same invPQ( ) function block 10 in FIG. 2. The invPQ( ) function block 10 requires information on either the voltage phasor v=(V,β) or the current phasor i=(I,γ) indicated by the (dotted) phasor information signal 26.

The phasor reference signal DER ref [v,i] 24 produced by the invPQ( ) function block 10 in FIG. 3 may have different embodiments, altering the signals used in the internal phasor control 16 in FIG. 3. In one embodiment called polar phasor current control, the function operation [I,α]=invPQ(P,Q) may refer to the computation of the polar coordinates (I,α) representing the power angle α=β−γ and the current amplitude I of the complex power current $I_p = I e^{j\alpha}$ computed from information of the real power P and reactive power Q according to α=a tan 2(Q,P) and $I = 2/V \cdot \sqrt{P^2 + Q^2}$. In another embodiment function called rectangular current phasor control the operation $[I_c, I_s]$=invPQ(P,Q) may refer to the computation of the rectangular coordinates $[I_c, I_s]$ representing the real part $I_c = I \cos(\alpha)$ and the imaginary part $I_s = I \sin(\alpha)$ of the complex power current $I_p = I e^{j\alpha}$ computed from information of the real power P and reactive power Q according to $I_c = 2P/V$ and $I_s = 2Q/V$ assuming the voltage V≠0.

Both the DER ref [v,i] 24 phasor reference signal and the DER [v,i] 28 phasor feedback signal enter the phasor control 16 that will compute a phasor control signal. More details on the inner workings of phasor control 16 is included in the discussion of FIG. 6 below.

The phasor control signal computed by the algorithm in phasor control 16 is then converted again to an DER power input signal DER [P,Q] 30 via the PQ( ) function block 6, defined also earlier in FIG. 2. The DER power input signal DER [P,Q] 30 is processed by the invPQ( ) function block 12 and the phasor source 14, both defined earlier in FIG. 2, to produce a phasor output DER [v,i] 28. The phasor output DER [v,i] 28 is now fed back to the Level 1 controller 18 for continuous monitoring of phasor behavior. Although not essential for the (feedback) operation of the phasor controller DER in FIG. 3, the phasor output DER [v,i] 28 can be converted back to real/reactive power signal DER [P,Q] 32 via the same PQ( ) function block 8 defined earlier in FIG. 2. The PQ( ) function block 8 given in FIG. 3 can be used to compare the (tracking) performance of real/reactive power signal DER [P,Q] 32 with respect to the real/reactive power reference signal DER ref [P,Q] 22.

The Level 1 CDER in FIG. 3 combines the benefits of the phasor controlled DER of FIG. 2 with phasor feedback to obtain more information about the individual voltage phasor signal v=(V,β) and current phasor signal i=(I,γ). Although conceptually, the arrangement of power control of the novel phasor-based approach in FIG. 3 is the same as in FIG. 2, the advantage of splitting the PQ 0 function block 8 from the phasor source 14 and providing direct phasor (v,i) feedback is that more information is brought into the Level 1 controller 18. Both voltage angle β and current angle γ are now available instead of the power angle α=β−γ only. Furthermore, the separation allows the dynamics of the control algorithm in the phasor control 16 to be designed on the basis of the dynamics of the phasor source 14.

As indicated earlier, with the linearity of the phasors (v,i) in the presence of linear impedances Z in the EPS, such a control algorithm will be much easier to design. In essence the feedback algorithm of the Level 1 CDER 20 in FIG. 3 internally uses phasor information, while from the outside the benefits of the feedback control in terms of power flow control can be observed from the real/reactive power signal DER [P,Q] 32. The concept of phasor feedback and the use of linear control algorithms feedback can also be extended to the case of multiple DERs.

Control of Multiple Distributed Energy Resources for Phasor Tracking

Figure 4:
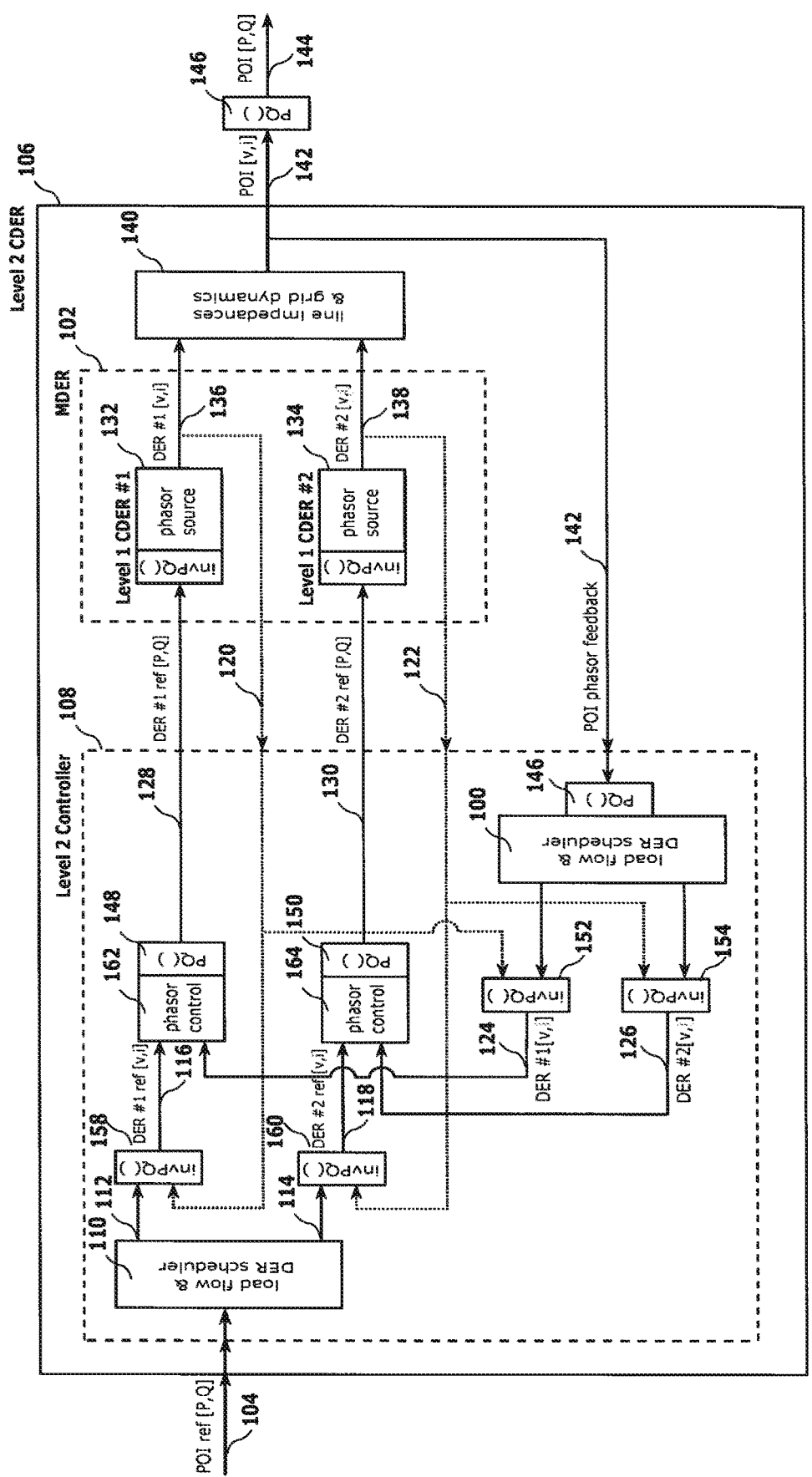
FIG. 4 is a schematic block diagram of a Level 2 phasor controlled multiple Distributed Energy Resource (DER), accepting a real/reactive power reference input at a Point Of Interest (POI) and producing a real/reactive power output at the POI, monitored and controlled by a Level 2 phasor controller that distributes and schedules real/reactive power input at the multiple DER and uses feedback of the produced phasor output at the POI, according to an embodiment of the present invention.

FIG. 4 summarizes the concept of the preferred embodiment of a decoupling synchrophasor based control system for a Multiple Distributed Energy Resources (MDER) that uses phasor signals for feedback to track real and reactive power reference signals. In the MDER 102, parallel placed lower level Controlled Distributed Energy Resources (CDERs) are now controlled by a Level 2 Controller 108. For reason of clarity and brevity, FIG. 4, shows an embodiment where the MDER 102 has only two parallel placed CDERs, given by the same generic function of the Level 1 CDER 20 defined earlier in FIG. 3 and labeled Level 1 CDER #1 132 and Level 1 CDER #2 134 in FIG. 4. However, embodiments of the same concept may include single or multiple instances of the Level 1 CDER 20 defined earlier in FIG. 3 and may also include single or multiple instances of the Level 0 CDER 34 defined earlier in FIG. 3.

As indicated earlier in FIG. 3, the Level 1 CDER 20 has the same input/output format as the Level 0 CDER 34 and the input to both a Level 1 CDER 20 and a Level 0 CDER 34 is a real/reactive input (reference) DER [P,Q] 30 signal and the output of both a Level 1 CDER 20 and a Level 0 CDER 34 is a DER [v,i] 28 phasor signal. This conformance and modularity allows a hierarchical control architecture at different levels, where similar phasor control 16 defined earlier in FIG. 3 can be used. The hierarchical control architecture at different levels is exploited in the Level 2

CDER 106 given in FIG. 4. The main difference between the Level 1 CDER 20 in FIG. 3 and the Level 2 CDER 106 in FIG. 4 is the fact that feedback information of a phasor signal POI [v,i] 142 at a Point Of Interest (POI) is used. Although a single POI phasor signal POI [v,i] 142 is used for feedback, multiple DERs in the MDER 102 are controlled to a desired POI [v,i] 142 phasor signal at a POI to achieve the desired real/reactive power flow POI ref [P,Q] 104 at a POI.

The information and power flow of the Level 2 CDER 106 in FIG. 4 is as follows. Starting from the left side of FIG. 4, the real/reactive POI power reference signal labelled POI ref [P,Q] 104 feeds into the Level 2 CDER 106 and then into the Level 2 Controller 108. In the Level 2 Controller 108, first the real/reactive POI power reference signal POI ref [P,Q] 104 is separated into individual real/reactive power reference signals 112 and 114 for each Level 1 distributed energy resource by the load flow & DER scheduler functional block 110.

An embodiment of the load flow & DER scheduler 110 may include an algorithm that decides which DERs participate in the level 2 control and at what percentage they will contribute. More advanced logic or load flow calculations can also be included in the load flow & DER scheduler functional block 110. The load flow and DER scheduler functions are current state of the art functions and are not included in this invention. This function is shown to indicate that the power allocation to individual DERs need to be determined algorithmically. So any method is suitable to be included.

The individual real/reactive power reference signals 112 and 114 for each level 1 DER are converted to individual phasor reference signals DER #1 ref [v,i] 116 and DER #2 ref [v,i] 118 by the separate invPQ( ) function blocks 158 and 160 in FIG. 4. The invPQ( ) function blocks 158 and 160 in FIG. 4 have the same generic functionality as the invPQ( ) function block 10 defined earlier in FIG. 2 and FIG. 3, but requires information on voltage phasor v=(V,β) or the current phasor i=(I,γ) of each DER indicated by the (dotted) phasor information signals 120 and 122.

The phasor reference signals DER #1 ref [v,i] 116 and DER #2 ref [v,i] 118 produced by the invPQ( ) function blocks 158 and 160 in FIG. 4 may have different embodiments, altering the phasor reference signals DER #1 ref [v,i] 116 and DER #2 ref [v,i] 118 feeding into in the phasor control 162 and 164 in FIG. 4. In one embodiment called polar phasor current control, the function operation [I,α]=invPQ(P,Q) may refer to the computation of the polar coordinates (I,α) representing the power angle α=β−γ and the current amplitude I of the complex power current $I_p = I e^{j\alpha}$ computed from information of the real power P and reactive power Q according to a=a tan 2(Q,P) and $I=2/V \cdot \sqrt{P^2+Q^2}$. In another embodiment function called rectangular current phasor control the operation $[I_c, I_s]$=invPQ(P,Q) may refer to the computation of the rectangular coordinates $[I_c, I_s]$ representing the real part $I_c = I \cos(\alpha)$ and the imaginary part $I_s = I \sin(\alpha)$ of the complex power current $I_p = I e^{j\alpha}$ computed from information of the real power P and reactive power Q according to $I_c = 2P/V$ and $I_s = 2Q/V$ assuming the voltage V≠0.

To use the individual phasor reference signals DER #1 ref [v,i] 116 and DER #2 ref [v,i] 118 for control in the phasor control 162 and 164, the DER #1 ref [v,i] 116 and DER #2 ref [v,i] 118 reference signals must be compared to individual phasor measurement signals DER #1 [v,i] 124 and DER #2 [v,i] 126 respectively. Since the separation of the individual phasor reference signals DER #1 ref [v,i] 116 and DER #2 ref [v,i] 118 were generated by the load flow & DER scheduler functional block 110, the individual phasor measurement signals DER #1 [v,i] 124 and DER #2 [v,i] 126 are generated by the same algorithm as used in the load flow & DER scheduler functional block 110 duplicated in FIG. 4 as block 100.

For that purpose, the POI phasor measurement signal POI [v,i] 142 is first sent through the PQ( ) functional block 146 to convert POI [v,i] 142 into a POI real/reactive power that is then subjected to the load flow & DER scheduler 100. For the conversion back to the individual phasor measurement signals DER #1 [v,i] 124 and DER #2 [v,i] 126, the invPQ( ) function blocks 152 and 154 are used and require information on either the voltage phasor v=(V,β) or the current phasor i=(I,γ) of each CDER indicated by the phasor information signals 120 and 122. The same phasor information signals 120 and 122 were used earlier to create the signals DER #1 ref [v,i] 116 and DER #2 ref [v,i] 118 via the invPQ( ) function blocks 158 and 160.

The phasor reference signals DER #1 ref [v,i] 116, DER #2 ref [v,i] 118 and the phasor feedback signals DER #1 ref [v,i] 124 and DER #2 ref [v,i] 126 enter the two individual phasor control 162 and 164 blocks that will compute a phasor control signal. In some embodiments the functional block of the phasor control 162 and 164 may have the same control algorithms as used in FIG. 3 for the Level 1 CDER 20, but may have different numerical values for the control algorithm, depending on the dynamics of the level 1 CDER to be controlled at level 2. For example, the Level 1 CDER #1 132 may refer to the fast dynamics on a battery/inverter system, while the Level 1 CDER #2 134 may refer to the slower dynamics on a gas turbine/generator system. Due to the difference between in dynamics between Level 1 CDER #1 132 and Level 1 CDER #2 134, the phasor control 162 and 164 for each Level 1 CDER may be similar in terms of algorithm, but different in terms of the numerical value used in the algorithm. More details on the inner workings of phasor control 162 and 164 block is included in the discussion of FIG. 6 below.

The phasor control signal computed by the algorithms in the individual phasor control 162 and 164 blocks are then converted to DER power reference input signals DER #1 ref [P,Q] 128 and DER #2 ref [P,Q] 130 via the PQ( ) function blocks 148 and 150. The PQ( ) function blocks 148 and 150 in FIG. 4 have the same generic functionality as the PQ( ) function block 6 in FIG. 2 and FIG. 3. The DER power reference input signal DER #1 ref [P,Q] 128 is processed by the Level 1 CDER #1 132 to an individual phasor output signal DER #1 [v,i] 136. Similarly, the DER power reference input signal DER #2 ref [P,Q] 130 is processed by the Level 1 CDER #2 134 to an individual phasor output signal DER #2 [v,i] 138. The processing by the Level 1 CDER #1 132 or Level 1 CDER #2 134 has the same generic functionality as the Level 1 CDER 20 defined earlier in FIG. 3.

The aggregated effect of the phasor output signals DER #1 [v,i] 136 and DER #2 [v,i] 138 is combined via the functional block representing the line impedances & grid dynamics 140 and results in a measurable phasor signal at the Point Of Interest POI [v,i] 142 in FIG. 4. The line impedances & grid dynamics 140 in FIG. 4 is a lumped functional block that represents the interconnections and electrical parameters of the EPS that would lead to the Point Of Interest phasor signal POI [v,i] 142 due to changes in the phasor output signals DER #1 [v,i] 136 and DER #2 [v,i] 138 produced by the Level 1 CDER #1 132 and Level 1 CDER #2 134. The phasor signal POI [v,i] 142 is again fed back to the Level 2 controller 108 for continuous monitoring of phasor behavior and control power flow. Although not essential for the (feedback) operation of the Level 2 controller 108 in FIG. 4, the phasor signal POI [v,i] 142 can be converted back to a POI real/reactive power signal POI [P,Q] 144 via the PQ( ) function block 146 given in FIG. 4. The PQ( ) function block 144 given in FIG. 4 can be used to compare the (tracking) performance of real/reactive power signal POI [P,Q] 144 with respect to the real/reactive power reference signal POI ref [P,Q] 104.

The voltage and current angles can be measured accurately using PMUs; however, as taught in the U.S. Pat. No. 8,457,912, the wrapping angle measurements of the phasors (V,β), (I,γ) are not smooth and therefore cannot be used for feedback control. This invention uses the smooth and unwrapped angle measurements as taught in U.S. Pat. No. 8,457,912 as well as the time synchronized values of the phasors (V,β), (I,γ) and the real/reactive power pair (P,Q) from a PMU or relay. These measurements, reported at high data rates, providing the means for the controllers to execute at much shorter time intervals compared to existing grid and macro-grid control systems.

The local EPS includes a number of protective relays, in particular across the circuit breaker separating the area EPS from the local EPS. Most modern relays include PMU calculations and provide these measurements at high data rates (60 Hz) to multiple clients. The controller subscribes to these PMU measurement streams to obtain the measurements needed for control. There are certain time delays in receiving the data; hence the need for the Smith Predictor functionality. In other implementations, where electromechanical relays are used, a new PMU measurement device is installed at the required location in the grid. These PMUs send the measurements to the controller using the same message protocols as used by the relays.

Control of Multiple Distributed Energy Resources for Voltage Phasor Tracking

Figure 5:
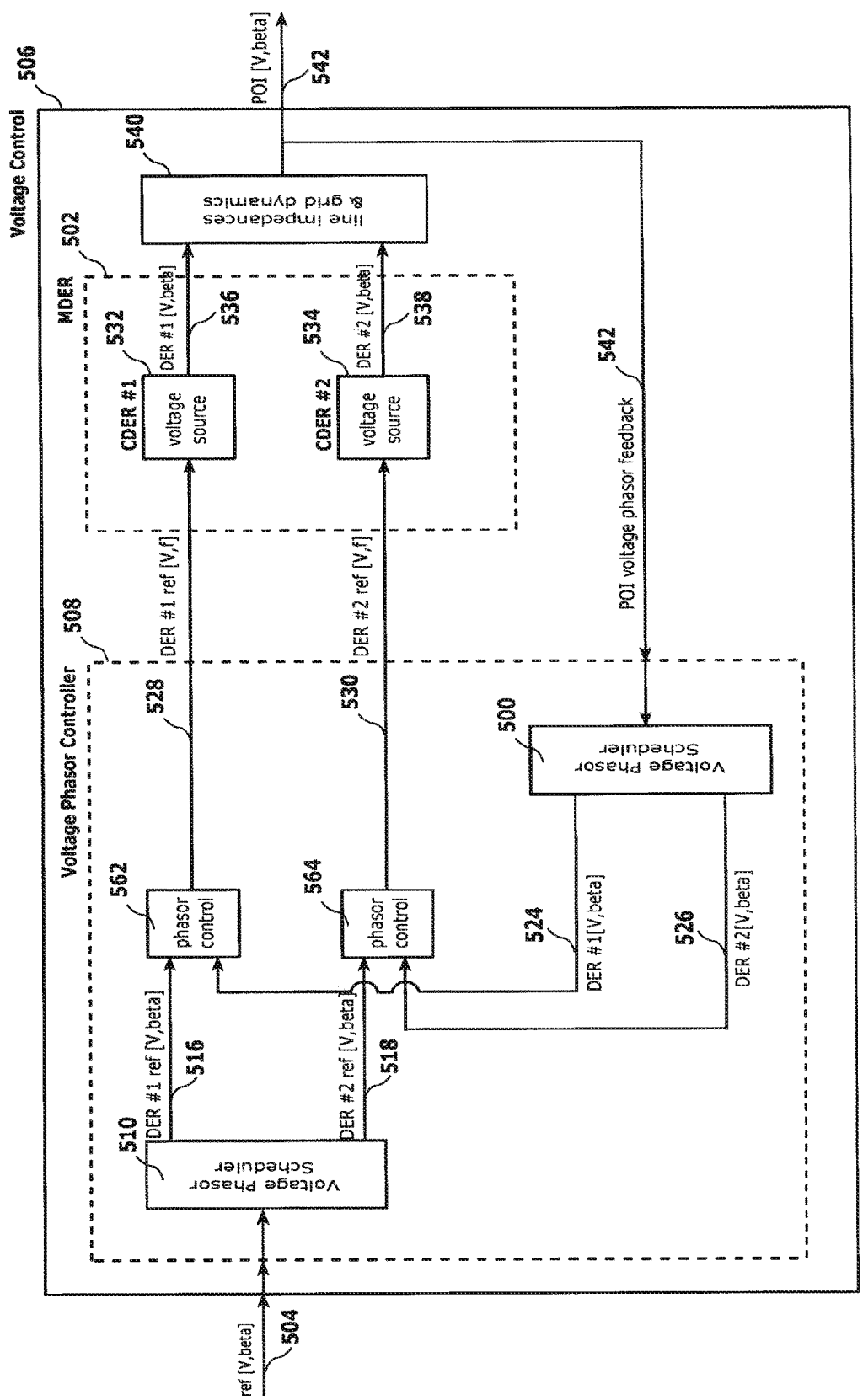
FIG. 5 is a schematic block diagram of a voltage phasor control multiple Distributed Energy Resource (DER), accepting a voltage phasor reference input at a Point Of Interest (POI) and producing a voltage phasor output at the POI, monitored and controlled by a voltage phasor controller that distributes and schedules voltage amplitude input and voltage phase angles at the multiple DER and uses feedback of the produced phasor output at the POI, according to an embodiment of the present invention.

FIG. 5 summarizes the concept of an alternative embodiment of a decoupling synchrophasor based control system for a Multiple Distributed Energy Resources (MDER) that uses phasor signals for feedback to track a voltage phasor reference signal ref [V,beta] 504. The voltage phasor typically consists of a (V, β) pair, where V is the voltage amplitude and β is the voltage angle. Tracking the voltage amplitude V and voltage angle β phasor reference signal ref [V,beta] 504 at a POI of the EPS and especially the Point of Common Coupling (PCC) of the EPS is important in case the EPS is disconnected from the main grid. Tracking the voltage amplitude V and voltage angle (3 of the main grid as a phasor reference signal ref [V,beta] 504 allows quick connect and disconnect of the EPS for islanding operations. Similar to FIG. 4, parallel placed Controlled Distributed Energy Resources (CDERs) in a single MDER 502 are now controlled by the Voltage Phasor Controller 508. For reason of clarity and brevity, FIG. 5 shows an embodiment where the MDER 502 has only two parallel placed CDERs and labeled CDER #1 532 and CDER #2 534 in FIG. 5. However, embodiments of the same concept may include single or multiple instances of the CDER Controlled Distributed Energy Resources (CDERs).

It can be observed that the Voltage Phasor Controller 508 has the same generic functionality as the Level 2 CDER 106 in FIG. 4, however all of the PQ( ) and invPQ( ) function blocks are removed. However, the phasor control 562 and 564 in FIG. 5 have the same the same generic functionality the phasor control 162 and 164 in FIG. 4 promoting modularity of the control architecture, where similar phasor control 16 defined earlier in FIG. 3 can be used.

The information flow of the Voltage Control 506 in FIG. 5 is as follows. Starting from the left side of FIG. 5, the voltage phasor reference signal labelled ref [V,beta] 504 feeds into the Voltage Control 506 and then into the Voltage Phasor Controller 508. In the Voltage Phasor Controller 508 the voltage phasor reference signal ref [V,beta] 506 is separated into individual voltage phasor reference signals DER #1 ref [V,beta] 516 and DER #2 ref [V,beta] 518 by the Voltage Phasor Scheduler functional block 510.

An embodiment of the Voltage Phasor Scheduler 510 may include an algorithm that decides which DERs participate in the voltage phasor control and at what percentage they will contribute. More advanced logic or load flow calculations can also be included in the Voltage Phasor Scheduler functional block 510.

To use the individual voltage phasor reference signals DER #1 ref [V,beta] 516 and DER #2 ref [V,beta] 518 for control in the phasor control 562 and 564, the DER #1 ref [V,beta] 516 and DER #2 ref [V,beta] 518 reference signals must be compared to individual voltage phasor measurement signals DER #1 [V,beta] 524 and DER #2 [V,beta] 526 respectively. Since the separation of the individual phasor voltage reference signals DER #1 ref [V,beta] 516 and DER #2 ref [V,beta] 518 were generated by the Voltage Phasor Scheduler functional block 510, the individual voltage phasor measurement signals DER #1 [V,beta] 524 and DER #2 [V,beta] 526 are generated by the same algorithm as used in the Voltage Phasor Scheduler functional block 510 duplicated in FIG. 5 as block 500 with as input the POI voltage phasor feedback measurement signal POI [v,beta] 542.

The phasor reference signals DER #1 ref [V,beta] 516, DER #2 ref [V,beta] 518 and the phasor feedback signals DER #1 ref [V,beta] 524 and DER #2 ref [V,beta] 526 enter the two individual phasor control 562 and 564 blocks that will compute a phasor control signals DER #1 [V,f] 528 and DER #2 [V,f] 530 where the variable f now refers to the frequency of the Voltage phasor. Conversion to frequency is done to accommodate the input to the voltage sources CDER #1 532 and CDER #2 534 that again produce a voltage phasor DER #1 [V,beta] 536 and voltage phasor DER #2 [V,beta] 538. CDERs such as inverters typically allow independent specification of Voltage amplitude V and frequency f of the AC voltage signal. In some embodiments the functional block of the phasor control 562 and 564 may have the same control algorithms as used in FIG. 4 phasor control 162 and 164 but may have different numerical values for the control algorithm, depending on the dynamics of the CDER to be controlled. More details on the inner workings of phasor control 562 and 564 block is included in the discussion of FIG. 6 below.

The aggregated effect of the voltage phasor DER #1 [V,beta] 536 produced by the voltage source CDER #1 532 and the voltage phasor DER #2 [V,beta] 538 produced by the voltage source CDER #2 534 is combined via the functional block representing the line impedances & grid dynamics 540 and results in a measurable voltage phasor signal POI [V,beta] 542 at the Point Of Interest in FIG. 5. The line impedances & grid dynamics 540 in FIG. 5 is a lumped functional block that represents the interconnections and electrical parameters of the EPS that would lead to the Point Of Interest phasor signal POI [V,beta] 542 due to changes in the phasor output signals DER #1 [V,beta] 536 and DER #2 [V,beta] 538 produced by the voltage sources CDER #1 532 and CDER #2 534. The voltage phasor signal POI [V,beta] 542 at the POI is again fed back to the Voltage Controller 508 for continuous monitoring of voltage phasor behavior and track voltage amplitude V and voltage angle β.

Phasor Controller

Figure 6:
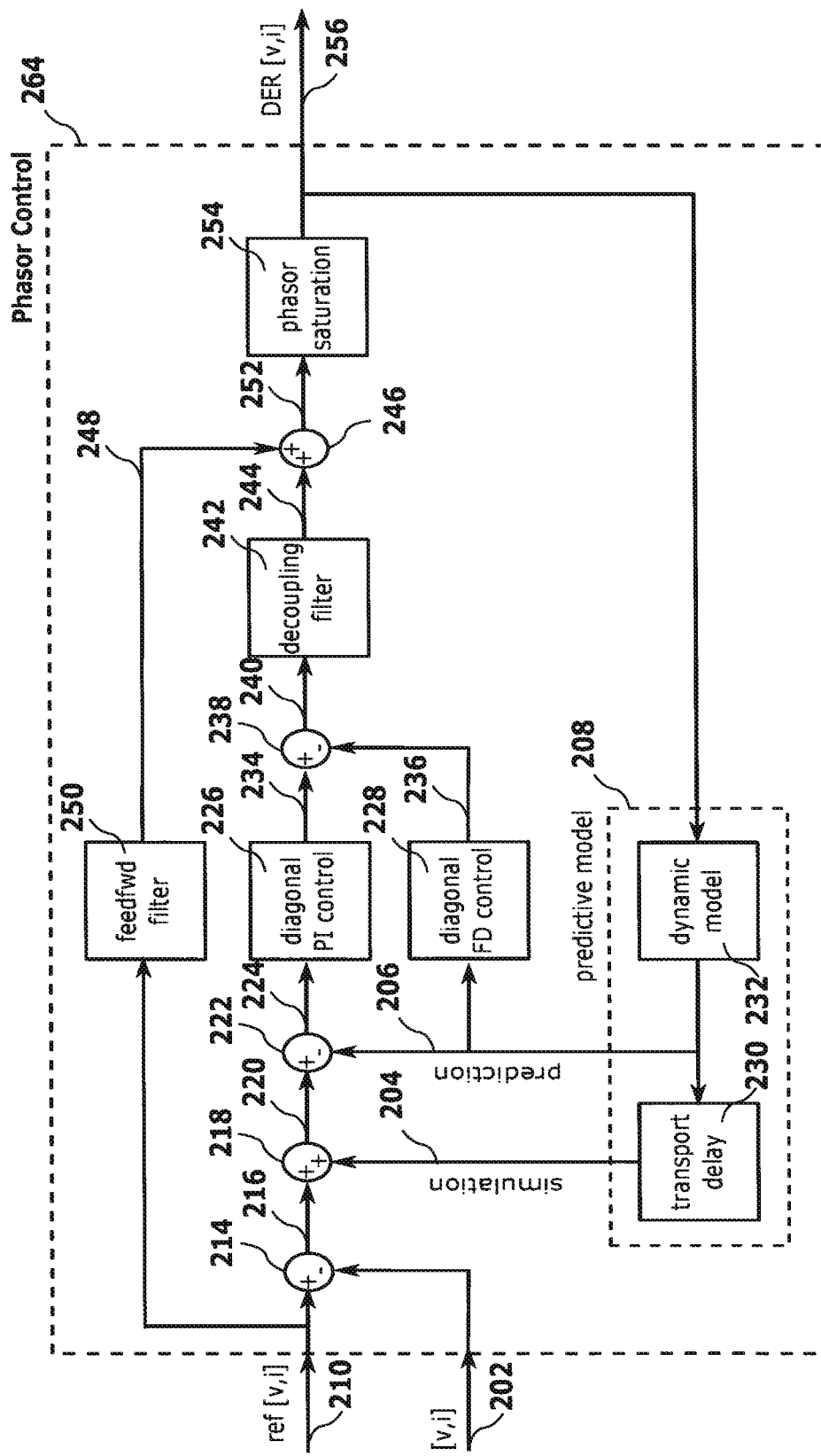
FIG. 6 is a schematic block diagram of the preferred embodiment of the control algorithms inside the phasor controller used in Level 1 and Level 2 phasor controlled Distributed Energy Resources, according to an embodiment of the present invention.

FIG. 6 summarizes the concept of the preferred embodiment of the phasor control 264 which implements the functionality of the phasor control 16 in FIG. 2 and FIG. 3, the phasor controls 162 and 164 in FIG. 4 and the phasor controls 562 and 564 in FIG. 5.

The preferred embodiment of phasor control 264 is a two-input, two-output decoupling synchrophasor based control algorithm that computes a phasor control output signal DER [v,i] 256 from the phasor reference signal ref [v,i] 210 and the phasor feedback data [v,i] 202. The phasor control 264 also includes a simulation signal 204 and a prediction 206 signal produced by a predictive model 208 to account for transport delay in obtaining the phasor feedback data [v,i] 202. An alternative embodiment of the phasor control 264 is given in the phasor control 364 in FIG. 7 where the predictive model 208 has been eliminated.

The information and power flow of the phasor control 264 in FIG. 6 is as follows. Starting from the left side of FIG. 6, both the phasor reference signal ref [v,i] 210 and the phasor feedback data [v,i] 202 enter the phasor control 264. In comparison with FIG. 3, the phasor reference signal ref [v,i] 210 may represent the phasor reference signal DER ref [v,i] 24 in FIG. 3. In comparison with FIG. 4, the phasor reference signal ref [v,i] 210 may represent the phasor reference signal DER #1 ref [v,i] 116 or the phasor reference signal DER #2 ref [v,i] 118 in FIG. 4.

In the phasor control 264 of FIG. 6, first the difference between the phasor reference signal ref [v,i] 210 and the phasor feedback data [v,i] 202 is computed by the difference junction 214 leading to the phasor error signal 216. The simulation signal 204 is added to the error signal 216 by the summing junction 218 leading to the simulation error signal 220. Subsequently, the difference between the simulation error signal 220 and the prediction signal 206 produced by the difference junction 222 leads to the control input signal 224 that is fed into the diagonal PI controller 226. At the same time, the prediction signal 206 is fed into the diagonal FD controller 228.

The role of the predictive model 208 is clear from the above described signal path. If the predictive model 208 provides an accurate simulation that includes the same transport delay 230 and the same dynamics modelled by the dynamic model 232 as seen in the phasor feedback data [v,i] 202, then the simulation error signal 220 would be zero and only the prediction signal 206 will appear in the control input signal 224. Since the prediction signal 206 is equivalent to the simulation signal 204, but without the transportation delay, the effect of transport delay in the phasor feedback data [v,i] 202 is completely compensated for, as only the prediction signal 206 will appear in the control input signal 224 that is fed into the diagonal PI controller 226. At the same time, the same prediction signal 206 is fed into the diagonal FD controller 228. As a result, the predictive model 208 also known as a Smith Predictor is an important ingredient of the decoupling synchrophasor based control algorithm used in the phasor control 264.

The diagonal PI controller 226 is a Proportional Integral (PI) controller. One embodiment of the diagonal PI controller 226 is the computation of the PI control output signal 234 as the sum of a proportional gain $K_p$ amplified control input signal 224 and an integral gain $K_i$ amplified time integrated control input signal 224. Other embodiments may include other linear combinations of a gain amplified control input signal 224 and time integrated control input signal 224 implemented in discrete-time filters.

The diagonal FD controller 228 is a Filtered Derivative (FD) controller. One embodiment of the diagonal FD controller 228 is the computation of the FD control output signal 236 as a derivative gain $K_d$ amplified filtered prediction signal 206. In the alternative embodiment of the phasor control 264 in FIG. 6, the diagonal FD controller 228 may be a derivative gain $K_d$ amplified filtered phasor feedback data [v,i] 202 implemented in discrete-time filters. Conventionally, the derivative operates on the error signal. In our case, in contrast, it operates on measured or predicted signal. The derivative contribution is not affected by setpoint changes that cause large output changes. Our controller responds to process disturbances rather than setpoint changes. We also have setpoint feedforward term for handing setpoint changes.

Worth noting is the fact that both the control input signal 224, the prediction signal 206 and the phasor feedback data [v,i] 202 are (at least) two dimensional input signals. As indicated earlier, in one embodiment called polar phasor current control, the phasor feedback data [v,i] 202 may refer to the polar coordinates (I,α) representing the power angle $\alpha=\beta-\gamma$ and the current amplitude I of the complex power current $I_p=Ie^{j\alpha}$. In another embodiment called rectangular current phasor control the phasor feedback data [v,i] 202 may refer to the rectangular coordinates $[I_c,I_s]$ representing the real part $I_c=I\cos(\alpha)$ and the imaginary part $I_s=I\sin(\alpha)$ of the complex power current $I_p=Ie^{j\alpha}$.

Given the fact that the control input signal 224 is at least a two dimensional signal, the diagonal PI controller 226 is a Proportional Integral (PI) controller that operates on each of the two signals included in the two dimensional control input signal 224 independently. The independent operation maintains decoupling between each of the two signals included in the two dimensional control input signal 224. Similarly, the diagonal FD controller 228 is a Filtered Derivative (FD) controller that operates on each of the two signals included in the two dimensional prediction signal 206 or the phasor feedback data [v,i] 202 independently. The independent operation maintains decoupling between each of the two signals included in the two dimensional control input signal 224.

Further decoupling is accomplished in the phasor control 264 of FIG. 6 by sending a linear combination of the PI control output signal 234 and the FD control output signal 236 produced by the difference or summing junction 238 as a control signal 240 to a multi-input, multi-output decoupling filter 242. The preferred embodiment of the decoupling filter 242 includes an output filter that can adjust the output signal according to the characteristics of the DER and is a multivariable dynamic system that aims to decouple the phasor feedback signal [v,i] either at the DER at Level 1 or at the POI at Level 2 control. The decoupling and output filters are combined into one filter for each of the elements in the decoupling matrix. This takes into account the dynamic decoupling and the output filters. The output filter is used to remove signals that the DER would not be able to respond to. For example, a rotating generator would not be able to respond to a 60 Hz varying signal, so this high frequency information is filtered out for this device. On the other hand, an inverter can respond to high frequency commands, and thus its output filter would be a high pass filter. That is, it filters out the low frequency content of the output signal. Thus, fast control signals go to inverters and slow control signals go to generators. This is not commonly done in control systems in industry and provides distinct advantages. An alternative embodiment of the decoupling filter 242 is to configure it as two single input and single output (SISO) controllers.

The output signal 244 of the decoupling filter 242 is combined by the summing junction 246 with the feedforward control signal 248 of the feedforward filter 250. The feedforward filter 250 directly takes the phasor reference signal ref [v,i] 210 to generate the feedforward control signal 248. The feedforward filter 250 in the phasor control 264 allows the control signals to directly respond to any changes in the phasor reference signal ref [v,i] 210 without first having to go through the diagonal PI controller 226 and may allow for a faster phasor control in response to set point changes in the phasor reference signal ref [v,i] 210 signal. The preferred embodiment of the feedforward filter 250 has the same generic functionality as the decoupling filter 242: a multivariable dynamic system that also aims to decouple the real and reactive output signal [P,Q] either at the DER at Level 1 or at the POI at Level 2 control. An alternative embodiment of the feedforward filter 250 is a fixed matrix gain to maintain or promote statically decoupled phasor feedback signal [v,i] either at the DER at Level 1 or at the POI at Level 2.

The final stage of the phasor control 264 of the preferred embodiment of FIG. 6 is to send the summation signal 252 obtained by summing junction 246 to a phasor saturation 254 to limit the phasor control output signal DER [v,i] 256. The phasor saturation may have different embodiments and can limit the range or rate of change of the power angle $\alpha$, the maximum current amplitude I, and/or the maximum and minimum rectangular coordinates $[I_c, I_s]$ representing the real part $I_c = I \cos(\alpha)$ and the imaginary part $I_s = I \sin(\alpha)$ of the complex power current $I_p = I e^{j\alpha}$ or any variations of these signals and/or their rate of change. In FIG. 6 the phasor control output signal DER [v,i] 256 is in turn used to produce the simulation 204 and prediction 206 signals to compensate for actual transport delay 230 using a dynamic model 232 that models the dynamics in the phasor feedback data [v,i] 202.

Figure 7:
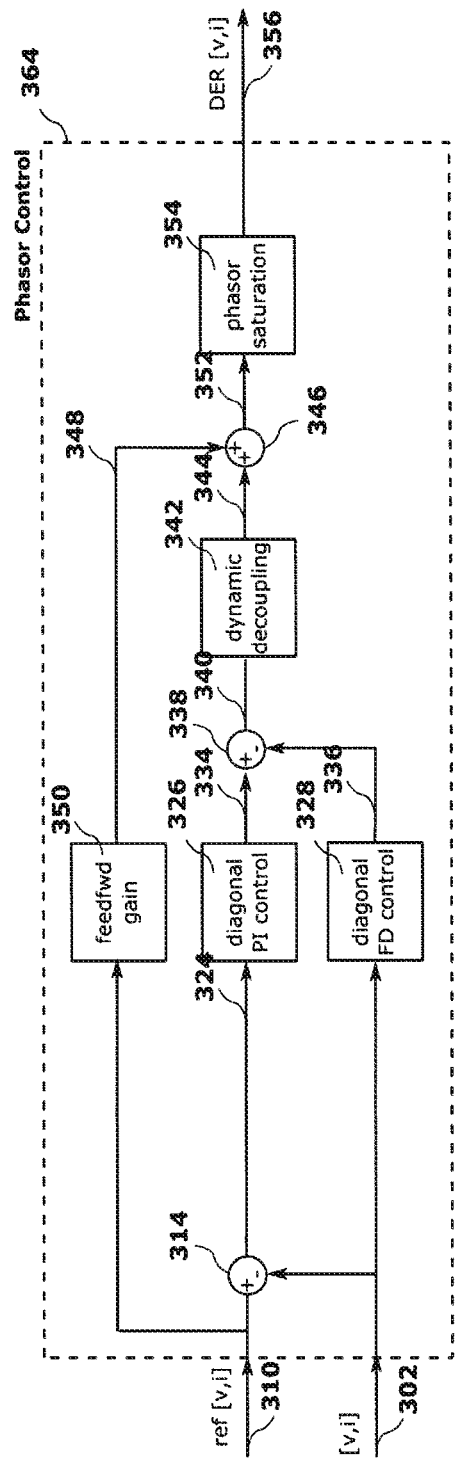
FIG. 7 is a schematic block diagram of an alternative embodiment of the control algorithms inside the phasor controller used in Level 1 and Level 2 phasor controlled Distributed Energy Resources, according to an embodiment of the present invention.

FIG. 7 summarizes the concept of the alternative embodiment of the phasor control 364 which implements the functionality of the phasor control 16 in FIG. 2 and FIG. 3 and the phasor controls 162 and 164 in FIG. 4. The alternative embodiment of phasor control 364 is also a two-input, two-output decoupling synchrophasor based control algorithm that computes a phasor control output signal DER [v,i] 356 from the phasor reference signal ref [v,i] 310 and the phasor feedback data [v,i] 302. In the alternative embodiment of the phasor control 364 is given in FIG. 7 the predictive model 208 of the preferred embodiment of FIG. 6 has been eliminated.

The information and power flow of the phasor control 364 in FIG. 7 is as follows. Starting from the left side of FIG. 7, both the phasor reference signal ref [v,i] 310 and the phasor feedback data [v,i] 302 enter the phasor control 364. In comparison with FIG. 3, the phasor reference signal ref [v,i] 310 may represent the phasor reference signal DER ref [v,i] 24 in FIG. 3. In comparison with FIG. 4, the phasor reference signal ref [v,i] 310 may represent the phasor reference signal DER #1 ref [v,i] 116 or the phasor reference signal DER #2 ref [v,i] 118 in FIG. 4.

In the phasor control 364 of FIG. 7, first the difference between the phasor reference signal ref [v,i] 310 and the phasor feedback data [v,i] 302 is computed by the difference junction 314 leading to the phasor error signal 324. This signal is fed into the diagonal PI controller 326.

The diagonal PI controller 326 is a Proportional Integral (PI) controller. One embodiment of the diagonal PI controller 326 is the computation of the PI control output signal 334 as the sum of a proportional gain $K_p$ amplified control input signal 324 and an integral gain $K_i$ amplified time integrated control input signal 324. Other embodiments may include other linear combinations of a gain amplified control input signal 324 and time integrated control input signal 324 implemented in discrete-time filters.

The diagonal FD controller 328 is a Filtered Derivative (FD) controller. One embodiment of the diagonal FD controller 328 is the computation of the FD control output signal 336 as a derivative gain $K_d$ amplified high pass filtered phasor feedback data [v,i] 302. In the alternative embodiment of the phasor control 364 in FIG. 7, the diagonal FD controller 328 may be a derivative gain $K_d$ amplified high pass filtered phasor feedback data [v,i] 302 implemented in discrete-time filters.

Worth noting is the fact that both the control input signal 324 and the phasor feedback data [v,i] 302 are (at least) two dimensional input signals. As indicated earlier, in one embodiment called polar phasor current control, the phasor feedback data [v,i] 302 may refer to the to the polar coordinates (I,$\alpha$) representing the power angle $\alpha = \beta - \gamma$ and the current amplitude I of the complex power current $I_p = I e^{j\alpha}$. In another embodiment called rectangular current phasor control the phasor feedback data [v,i] 302 may refer to the rectangular coordinates $[I_c, I_s]$ representing the real part $I_c = I \cos(\alpha)$ and the imaginary part $I_s = I \sin(\alpha)$ of the complex power current $I_p = I e^{j\alpha}$.

Given the fact that the control input signal 324 is at least a two dimensional signal, the diagonal PI controller 326 is a Proportional Integral (PI) controller that operates on each of the two signals included in the two dimensional control input signal 324 independently. The independent operation maintains decoupling between each of the two signals included in the two dimensional control input signal 324. Similarly, the diagonal FD controller 328 is a Filtered Derivative (FD) controller that operates on each of the two signals included in the two dimensional prediction signal 306 or the phasor feedback data [v,i] 302 independently. The independent operation maintains decoupling between each of the two signals included in the two dimensional control input signal 324.

Further decoupling is accomplished in the phasor control 364 of FIG. 7 by sending the difference (or sum) of the PI control output signal 334 and the FD control output signal 336 produced by the difference or summing junction 338 as a control signal 340 to a multi-input, multi-output decoupling filter 342. The preferred embodiment of the decoupling filter 342 includes an output filter that can adjust the output signal according to the characteristics of the DER and is a multivariable dynamic system that aims to decouple the real and reactive output signal [P,Q] either at the DER at Level 1 or at the POI at Level 2 control. An alternative embodiment of the decoupling filter 342 is a fixed matrix gain to statically decouple the phasor feedback signal [v,i] either at the DER at Level 1 or at the POI at Level 2.

The output signal 344 of the decoupling filter 342 is combined by the summing junction 346 with the feedforward control signal 348 of the feedforward filter 350. The feedforward filter 350 directly takes the phasor reference signal ref [v,i] to generate the feedforward control signal 348. The feedforward filter 350 in the phasor control 364 allows the control signals to directly react to any changes in the phasor reference signal ref [v,i] 310 without first having to go through the diagonal PI controller 326 and may allow for a faster phasor control in response to set point changes in the phasor feedback signal [v,i] 302. The preferred embodiment of the feedforward filter 350 is similar to the decoupling filter 342: a multivariable dynamic system that also aims to decouple the phasor feedback signal [v,i] either at the DER at Level 1 or at the POI at Level 2 control. An alternative embodiment of the feedforward filter 350 is a fixed matrix gain to maintain or promote statically decoupled the phasor feedback signal [v,i] either at the DER at Level 1 or at the POI at Level 2.

The final stage of the phasor control 364 of the alternative embodiment of FIG. 7 is to send the summation signal 352 obtained by summing junction 346 to a phasor saturation 354 to limit the phasor control output signal DER [v,i] 356. The phasor saturation may have different embodiments and can limit the range or rate of change of the power angle $\alpha$, the maximum current amplitude I, and/or the maximum and minimum rectangular coordinates $[I_c, I_s]$ representing the real part $I_c = I \cos(\alpha)$ and the imaginary part $I_s = I \sin(\alpha)$ of the complex power current $I_p = Ie^{j\alpha}$ or any variations of these signals and/or their rate of change.

The functional blocks described herein can best be implemented in commercial computing platforms such as advanced Programmable Logic Controllers (PLCs) or in industrial grade PCs such as the SEL 3355 that runs multiple tasks, one of which is the controller. The controller processing functionality can be written in any computer language, but one implementation is using C++ running on Windows or Linux operating systems. The output commands from then controller may use standard control protocols such as IEC 61850 Goose or Modbus over Ethernet. In order to maintain high security, fiber optic connections are generally used between the controller platform and the inverter device that is used to control the real and reactive power flow to the local EPS. For example, the PQ( ) and invPQ( ) functions are preferably implemented using the standard trigonometry and square root functions provided in the computer language used to implement the controller.

Figure 8:
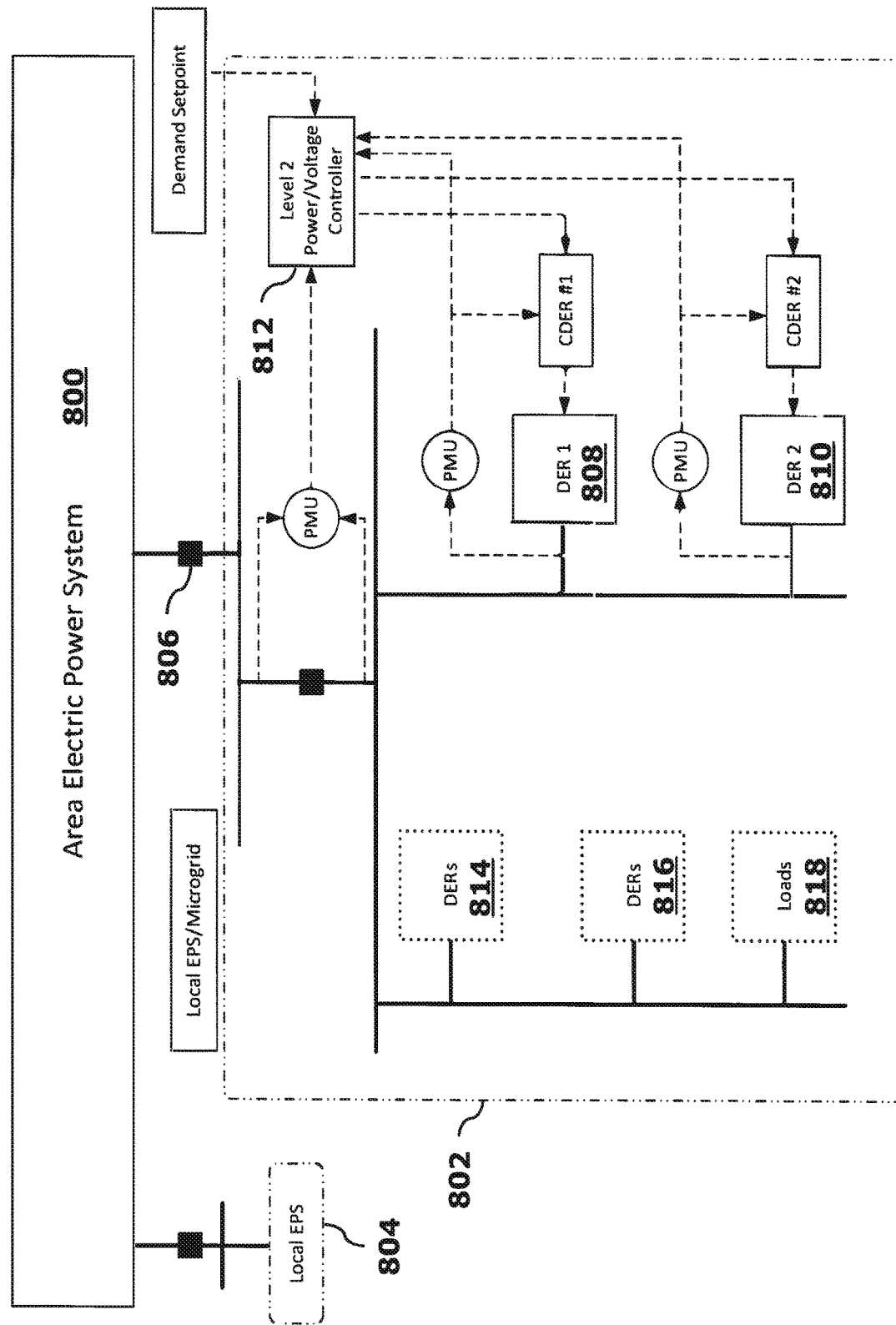
FIG. 8 is a schematic diagram of an area EPS connected to a local EPS having a hierarchical control of DERs, according to an embodiment of the present invention.

FIG. 8 shows the relationship between the area Electric Power System (EPS) 800 and a local EPS 802. Two local EPS systems 802 and 804 are shown connected to the area EPS 800. An electrical disconnect switch 806 is shown between the area EPS 800 and the local EPS 802. This is called the Point of Common Coupling. When this switch is opened, the local EPS 802 must maintain its own supply and demand balance. The energy demand has to match the energy supply. In FIG. 8, two level one controlled distributed energy resources (CDER) DER 1 808 and DER 2 810 are shown being controlled by a Level 2 Power/Voltage controller 812. This controller supervises the two CDERs 808 and 810 to maintain an energy balance while disconnected and provide control of the total demand of the grid while the local EPS 802 is connected to the area EPS 800.

The demand setpoint is determined in two ways: if connected, the demand from the area EPS is determined such that the maximum value to the local EPS 802 is achieved; if disconnected, the supply and demand is determined by the available energy in the CDERs 808 and 810 and the production of power from uncontrolled DERs 814, 816, or loads 818.

PMUs are used for control of the CDERs 808 and 810 at high data rates, typically 60 Hz. The setpoints for the CDERs are determined by the level 2 Power/Voltage controller 812. Note that the level 2 controller 812 sends both real and reactive power commands to the CDERS 808 and 810 as well as frequency and voltage setpoint commands. The real and reactive power commands ensure an energy balance in the local EPS and the frequency and voltage setpoints ensure that the voltage and voltage angle of the local EPS tracks the voltage and voltage angle of the area EPS. This allows the local EPS 802 to disconnect and reconnect to the area EPS 800 on command. This is an important feature of any microgrid controller.

What is claimed is:

1. A method of controlling an electrical power system comprising:
    feeding back a synchronized measurement of a phasor or a synchrophasor from one or more measurement units to a feedback controller; and
    controlling distributed energy resources forming part of the electrical power system with the feedback controller using feedback control algorithms by sending, to the distributed energy resources, a power setpoint derived from the synchronized measurement of the phasor or the synchrophasor.

2. The method of claim 1, wherein the feedback control algorithms comprise linear feedback control algorithms.

3. The method of claim 1, further comprising decoupling the synchronized measurement into a real power component and a reactive power component, or a frequency component and a voltage component.

4. The method of claim 1, wherein the feedback controller is a single variable linear controller.

5. The method of claim 1, wherein the power setpoint comprises a real power setpoint or a reactive power setpoint or a frequency setpoint or a voltage setpoint.

6. The method of claim 1, wherein the phasor comprises a voltage phasor or a current phasor with or without time-synchronization.

7. The method of claim 1, wherein the feeding back comprises feeding back the time-synchronized measurement from multiple level 1 controllers to a level 2 controller, and wherein the feedback controller forms a hierarchical feedback control system.

8. The method of claim 1, wherein the feeding back comprises converting measured current phasors or voltage phasors to real power values or reactive power values.

9. The method of claim 1, wherein the feeding back comprises converting measured real power values or reactive power values to voltages and voltage angle differences between points of interest and the distributed energy resources.

10. The method of claim 1, wherein controlling the distributed energy resources by the feedback controller comprises using a proportional-integral controller combined with a derivative filter to mitigate power grid disturbances, and an output filter to adjust an output setpoint according to a response characteristic of the distributed energy resources.

11. The method of claim 1, wherein controlling the distributed energy resources by the feedback controller comprises using a predictive model to account for system dynamics and transport delay in obtaining the synchronized measurements.

12. The method of claim 1, wherein controlling the distributed energy resources by the feedback controller comprises using a feed forward filter for providing a faster response to immediate set point changes.

13. The method of claim 1, wherein controlling the distributed energy resources comprises computing the power setpoint to achieve a predetermined power control at a Point Of Interest.

14. The method of claim 1, wherein the distributed energy resources comprise a combination of energy generation devices, controllable energy loads, and energy storage devices.

15. The method of claim 1, wherein the synchronized measurement is fed back at a frequency rate up to about 60 Hertz.

16. The method of claim 1, wherein the synchronized measurement is time synchronized using a global positioning system, a Network Time Protocol (NTP), or a Precision Time Protocol (PTP).

17. A system for controlling an electrical power system comprising:
at least one controller;
memory storing instructions which when executed by the at least one controller result in operations comprising:
feeding back a synchronized measurement of a phasor or a synchrophasor from one or more measurement units to a feedback controller; and
controlling distributed energy resources forming part of the electrical power system with the feedback controller using feedback control algorithms by sending, to distributed energy resources, a power setpoint derived from the synchronized measurement of the phasor or the synchrophasor.

18. The system of claim 17, wherein the feedback control algorithms comprise linear feedback control algorithms.

19. The system of claim 17, further comprising decoupling the synchronized measurement into a real power component and a reactive power component, or a frequency component and a voltage component.

20. The system of claim 17, wherein the feedback controller is a single variable linear controller.

21. The system of claim 17, wherein the power setpoint comprises a real power setpoint or a reactive power setpoint or a frequency setpoint or a voltage setpoint.

22. The system of claim 17, wherein the phasor comprises a voltage phasor or a current phasor with or without time-synchronization.

23. The system of claim 17, wherein the feeding back comprises feeding back the time-synchronized measurement from multiple level 1 controllers to a level 2 controller, and wherein the feedback controller forms a hierarchical feedback control system.

24. The system of claim 17, wherein the feeding back comprises converting measured current phasors or voltage phasors to real power values or reactive power values.

25. The system of claim 17, wherein the feeding back comprises converting measured real power values or reactive power values to voltages and voltage angle differences between points of interest and the distributed energy resources.

26. The system of claim 17, wherein controlling the distributed energy resources by the feedback controller comprises using a proportional-integral controller combined with a derivative filter to mitigate power grid disturbances, and an output filter to adjust an output setpoint according to a response characteristic of the distributed energy resources.

27. The system of claim 17, wherein controlling the distributed energy resources by the feedback controller comprises using a predictive model to account for system dynamics and transport delay in obtaining the synchronized measurements.

28. The system of claim 17, wherein controlling the distributed energy resources by the feedback controller comprises using a feed forward filter for providing a faster response to immediate set point changes.

29. The system of claim 17, wherein controlling the distributed energy resources comprises computing the power setpoint to achieve a predetermined power control at a Point Of Interest.

30. The system of claim 17, wherein the distributed energy resources comprise a combination of energy generation devices, controllable energy loads, and energy storage devices.

31. The system of claim 17, wherein the synchronized measurement is fed back at a frequency rate up to about 60 Hertz.

32. The system of claim 17, wherein the synchronized measurement is time synchronized using a global positioning system, a Network Time Protocol (NTP) or a Precision Time Protocol (PTP).

33. A controller having computer-readable program instructions, which when executed result in operations comprising:
feeding back a synchronized measurement of a phasor or a synchrophasor from one or more measurement units to a feedback controller; and
controlling distributed energy resources forming part of an electrical power system by the feedback controller using feedback control algorithms by sending, to the distributed energy resources, a power setpoint derived from the synchronized measurement of the phasor or the synchrophasor.

34. The controller of claim 33, wherein the feedback control algorithms comprise linear feedback control algorithms.

35. The controller of claim 33, further comprising decoupling the time-synchronized measurement into a real power component and a reactive power component, or a frequency component and a voltage component.

36. The controller of claim 33, wherein the feedback controller is a single variable linear controller.

37. The controller of claim 33, wherein the power setpoint comprises a real power setpoint or a reactive power setpoint or a frequency setpoint or a voltage setpoint.

38. The controller of claim 33, wherein the phasor comprises a voltage phasor or a current phasor with or without time-synchronization.

39. The controller of claim 33, wherein the feeding back comprises feeding back the time-synchronized measurement from multiple level 1 controllers to a level 2 controller, and wherein the feedback controller forms a hierarchical feedback control system.

40. The controller of claim 33, wherein the feeding back comprises converting measured current phasors or voltage phasors to real power values or reactive power values.

41. The controller of claim 33, wherein the feeding back comprises converting measured real power values or reactive power values to voltages and voltage angle differences between points of interest and the distributed energy resources.

42. The controller of claim 33, wherein controlling the distributed energy resources by the feedback controller comprises using a proportional-integral controller combined with a derivative filter to mitigate power grid disturbances, and an output filter to adjust an output setpoint according to a response characteristic of the distributed energy resources.

43. The controller of claim 33, wherein controlling the distributed energy resources by the feedback controller comprises using a predictive model to account for system dynamics and transport delay in obtaining the synchronized measurements.

44. The controller of claim 33, wherein controlling the distributed energy resources by the feedback controller comprises using a feed forward filter for providing a faster response to immediate set point changes.

45. The controller of claim 33, wherein controlling the distributed energy resources comprises computing the power setpoint to achieve a predetermined power control at a Point Of Interest.

46. The controller of claim 33, wherein the distributed energy resources comprise a combination of energy generation devices, controllable energy loads, and energy storage devices.

47. The controller of claim 33, wherein the synchronized measurement is fed back at a frequency rate up to about 60 Hertz.

48. The controller of claim 33, wherein the synchronized measurement is time synchronized using a global positioning system, a Network Time Protocol (NTP) or a Precision Time Protocol (PTP).

49. A method of controlling an electrical power system comprising:
   feeding back synchronized measurements characterizing at least one aspect of an electrical power system to a feedback controller; and
   controlling distributed energy resources forming part of the electrical power system by the feedback controller by sending, to the distributed energy resources, a power setpoint derived from the synchronized measurements.

* * * * *